(12) United States Patent
Lian et al.

(10) Patent No.: US 7,001,781 B2
(45) Date of Patent: Feb. 21, 2006

(54) METHOD FOR PRODUCING A FERROELECTRIC CAPACITOR THAT INCLUDES ETCHING WITH HARDMASKS

(75) Inventors: Jenny Lian, New York, NY (US); Ulrich Egger, Kanagawa-ken (JP); Haoren Zhuang, Tokyo-to (JP)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/672,306

(22) Filed: Sep. 26, 2003

(65) Prior Publication Data
US 2005/0067649 A1    Mar. 31, 2005

(51) Int. Cl.
*H01L 21/475*    (2006.01)
(52) U.S. Cl. ......................... 438/3; 438/396
(58) Field of Classification Search .............. 438/3, 438/240, 253, 396; 257/532
See application file for complete search history.

(56) References Cited

U.S. PATENT DOCUMENTS

| | | | |
|---|---|---|---|
| 6,171,970 B1 * | 1/2001 | Xing et al. .................. 438/706 |
| 6,295,195 B1 | 9/2001 | Maejima | |
| 6,351,006 B1 | 2/2002 | Yamakawa et al. | |
| 6,376,259 B1 * | 4/2002 | Chu et al. ....................... 438/3 |
| 6,423,592 B1 * | 7/2002 | Sun ............................. 438/240 |
| 2002/0158278 A1 | 10/2002 | Ozawa et al. | |
| 2003/0006439 A1 * | 1/2003 | Bailey .......................... 257/295 |
| 2003/0008517 A1 | 1/2003 | Ko et al. | |
| 2003/0119251 A1 | 6/2003 | Aggarwal et al. | |
| 2003/0215960 A1 * | 11/2003 | Mitsuhashi .................... 438/3 |
| 2004/0150923 A1 * | 8/2004 | Egger et al. .................. 361/15 |
| 2004/0251514 A1 * | 12/2004 | Abadeer et al. ............. 257/532 |

FOREIGN PATENT DOCUMENTS

| | | |
|---|---|---|
| EP | 0 911 871 | 4/1999 |
| EP | 1 345 258 | 9/2003 |

* cited by examiner

*Primary Examiner*—Stephen W. Smoot
(74) *Attorney, Agent, or Firm*—Fish & Richardson P.C.

(57) ABSTRACT

A method for fabricating a device and a device, such as a ferroelectric capacitor, having a substrate, a contact plug through the substrate, a first barrier layer on the substrate, a first electrode on the first barrier layer, a dielectric layer on the first electrode, and a second electrode on the dielectric layer, comprises etching the second electrode and the dielectric layer of the device using a first hardmask, to shape the second electrode and the dielectric layer. The first hardmask is then removed and one or more encapsulating layers are applied to the second electrode and the dielectric layer. A further hardmask is applied to the one or more encapsulating layers. The first electrode is then etched according to the second hardmask down to the first barrier layer and the second hardmask is then removed from the one or more encapsulating layers.

8 Claims, 5 Drawing Sheets

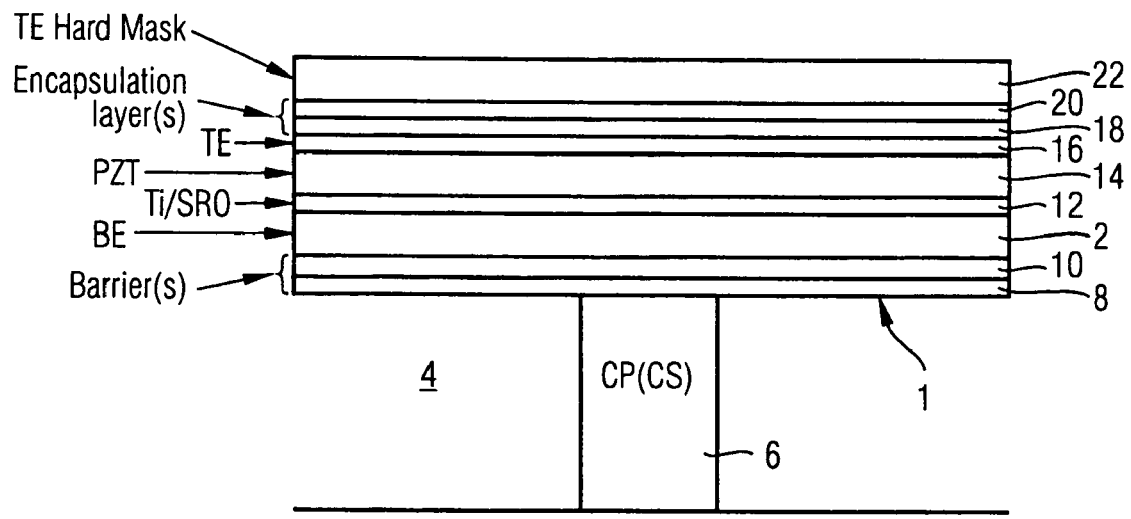
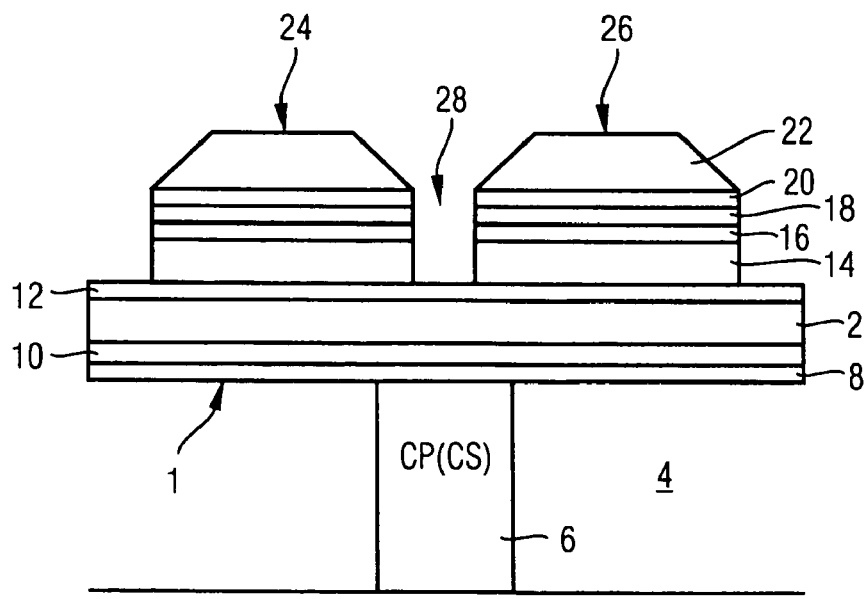

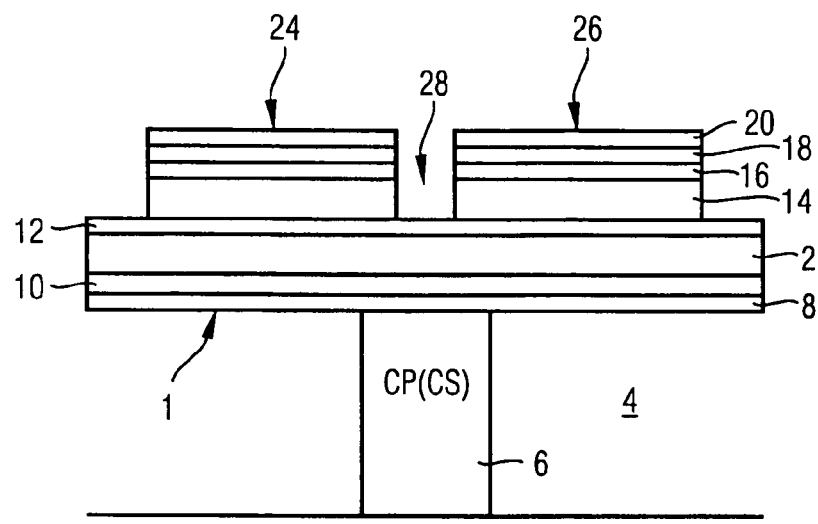
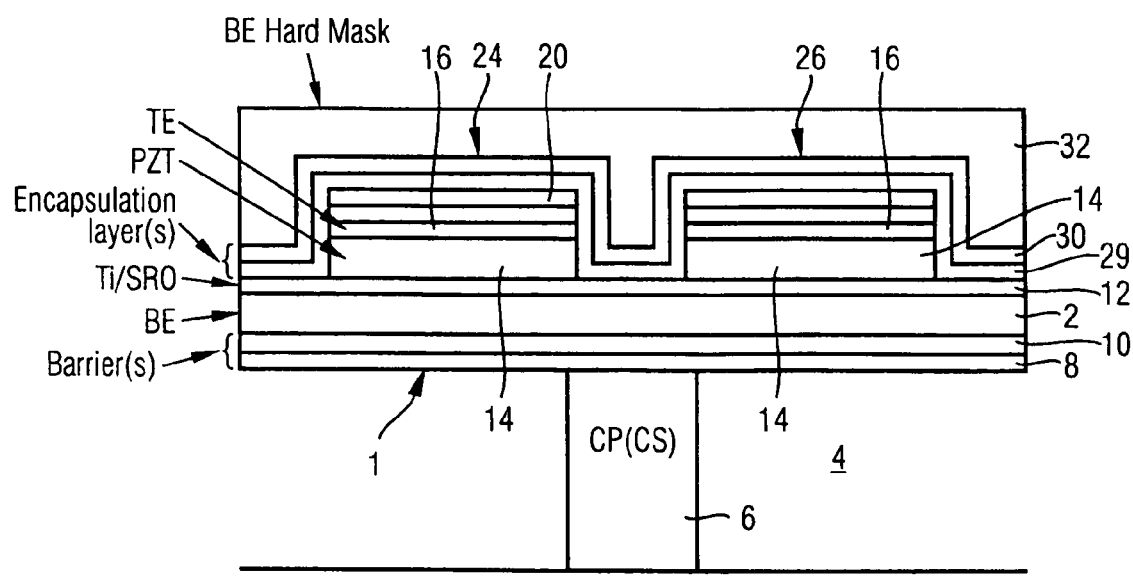

METHOD FOR PRODUCING A FERROELECTRIC CAPACITOR THAT INCLUDES ETCHING WITH HARDMASKS

FIELD OF THE INVENTION

The present invention relates to methods for producing a ferroelectric capacitor, and a ferroelectric capacitor device, in particular, a reduced height ferroelectric capacitor device.

BACKGROUND OF THE INVENTION

A conventional ferroelectric capacitor includes one or more ferroelectric layers sandwiched between a bottom electrode and a top electrode. The ferroelectric layer(s) may include, for example, PZT, SBT or BLT. The capacitor is covered with one or more interlayer dielectric layers, normally Tetraethyl Orthosilicate (TEOS), and connection to the top electrode is achieved by etching a window through the interlayer dielectric layer(s) and filling the window with a metal filler. The bottom electrode is mounted on a substrate, the electrical connection to the bottom electrode being via a metal plug through the substrate. To make the connection between the bottom electrode and the plug, a window is formed through the interlayer dielectric layer(s), through the other layers of the capacitor and into the plug. A liner is formed in this window and a metal filler is deposited in the bottom of the window to make the contact between the bottom electrode and the plug. The liner and the metal filler are etched to leave just the contact to the plug. Encapsulation layers and cover layers are added to protect the resultant capacitor.

In the production of conventional capacitors it is known to etch the top and bottom electrodes in separate processes, and, in each case, a hardmask is used to define the etch pattern. Normally, after etching, the remainder of the hardmask is left in situ and further layers are deposited over the remnants of the hardmask, as required, and these remnants and layers are incorporated into the final device. This increases the height of the resultant capacitor device.

A number of problems may arise due to the typical height of conventional ferroelectric capacitors (around 17600 Angstroms (A), about one third of which is due to the presence of the hardmask layers). For example, the typical aspect ratio between the length of the window to the bottom electrode and the width of the window (typically 4:1) makes it difficult to deposit a liner (of, for example, VO) therein. Furthermore, due to the height of conventional capacitors, it is difficult to include a number of such capacitors in a device where space is limited.

In view of the foregoing problems with conventional processes and devices, a need exists for an easily applied method for producing capacitors of less than conventional height without reducing production yield or compromising performance.

SUMMARY OF THE INVENTION

In general terms, the present invention proposes that the remnants of hardmask remaining after completion of the etching of the top and bottom electrodes be removed to reduce significantly the height of the completed device, for example to around 9800 Angstroms. This is considered particularly advantageous as it permits a reduction in the height of the device without compromising performance of the device.

Furthermore, the aspect ratio between the length of the window to the bottom electrode and the width of the window (typically 4:1 in conventional devices) may be reduced in devices according to the present invention, down to a ratio of less than 3:1, enabling easier insertion of the contact liner into the window and facilitating TiN deposition into the lined window.

According to a first aspect of the present invention there is provided a method for fabricating a device having a substrate, a contact plug through the substrate, a first barrier layer on said substrate, a first electrode on said first barrier layer, a dielectric layer on said first electrode, and a second electrode on said dielectric layer, the method comprising the steps of:
  forming a first hardmask over the second electrode;
  etching said second electrode and said dielectric layer of said device, using said first hardmask to shape said second electrode and said dielectric layer;
  removing said first hardmask;
  applying one or more encapsulating layers to said second electrode and said dielectric layer;
  applying a second hardmask to said one or more encapsulating layers;
  etching said first electrode according to said second hardmask down to said first barrier layer; and
  removing said second hardmask from said one or more encapsulating layers.

According to a second aspect of the present invention there is provided a device comprising:
  a substrate;
  a contact plug passing through said substrate;
  a first barrier layer formed on said substrate;
  a first electrode formed on said first barrier layer;
  a dielectric layer formed on said first electrode;
  a second electrode formed on said ferroelectric layer;
  a first encapsulation layer formed directly on said second electrode;
  one or more further encapsulation layers formed directly on said first encapsulation layer, said one or more further encapsulation layers extending to said first electrode to protect side faces of said dielectric layer;
  one or more cover layers formed on said one or more further encapsulation layers.

According to a third aspect of the present invention there is provided a ferroelectric capacitor device comprising the device defined above.

According to a fourth aspect of the present invention there is provided a device formed according to the method defined above.

According to a fifth aspect of the present invention there is provided a Random Access Memory device comprising one or more devices defined above.

BRIEF DESCRIPTION OF THE FIGURES

Preferred features of the invention will now be described, for the sake of illustration only, with reference to the following Figures in which:

FIG. 1a is a schematic cross-sectional view of a capacitor in a first stage of formation according to an embodiment of the present invention;

FIG. 1b is a schematic cross-sectional view of a capacitor in a second stage of formation according to an embodiment of the present invention;

FIG. 1c is a schematic cross-sectional view of a capacitor in a third stage of formation according to an embodiment of the present invention;

FIG. 2a is a schematic cross-sectional view of a capacitor in a fourth stage of formation according to an embodiment of the present invention;

FIGS. 3a and 3b show, respectively, schematic cross-sectional views of a capacitor according to the invention in the seventh stage of completion, and a prior art capacitor prior to completion needing only the windows and electrode connections to be added, the prior art capacitor of FIG. 3b being at the equivalent stage of completion as the capacitor according to the present invention shown in FIG. 3a.

DETAILED DESCRIPTION OF PREFERRED EMBODIMENTS

Figure 2B:
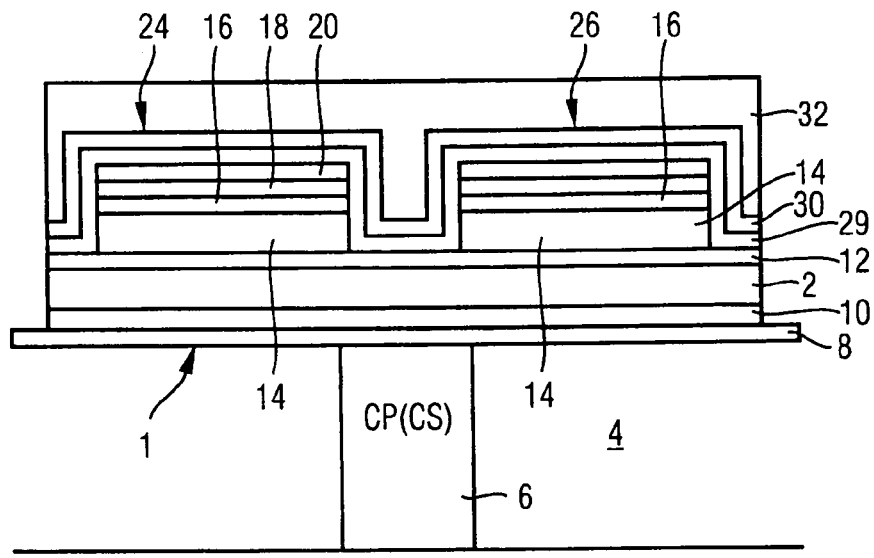
FIG. 2b is a schematic cross-sectional view of a capacitor in a fifth stage of formation according to an embodiment of the present invention.

FIGS. 1a to 3a show the various processing stages of a device such as a ferroelectric capacitor, according to a preferred embodiment of the present invention.

A ferroelectric capacitor 1, such as that shown in FIG. 1a, consists of a bottom electrode 2 mounted on a substrate 4, and a metal plug 6 is formed which extends through the substrate 4 to establish electrical connection to the bottom electrode 2 via the metal plug 6 A first barrier layer 8 is deposited on the surface of the substrate 4 and a second barrier layer 10 is deposited on the first barrier layer 8. The barrier layers 8, 10 are composed of electrically conducting material.

The bottom electrode 2 is deposited on the second barrier layer 10. A layer 12 of, for example, titanium (Ti) or an oxygen electrode, for example $SrRuO_3$ (SRO), is applied on the surface of the bottom electrode 2. The layer 12 is effectively an upper part of the bottom electrode 2. The top electrode 16 (which may be formed of platinum (Pt)) is deposited on the ferroelectric layer 14. A number of encapsulation layers 18, 20, for example two layers as shown in FIG. 1a, are deposited over the top electrode 16. A hardmask 22 of, for example, Tetraethyl Orthosilicate (TEOS), is deposited over the encapsulation layers 18, 20. The hardmask 22 is then patterned.

FIG. 1b shows the next stage in the production process which involves an RIE (reactive ion etch) of the encapsulation layers 18, 20, the top electrode 16 and the layer of ferrorelectric material 14, according to the hardmask 22, to divide the material into separate capacitors 24, 26, having a common bottom electrode 2. The capacitors 24, 26 are separated by a window 28.

FIG. 1c shows the next stage in the production process in which the hardmask 22 applied over the encapsulation layers 18, 20 is dry etched in a process which has a high etching selectivity of TEOS compared to, for example, SRO or Pt. This dry etch thereby attacks the hardmask 22 (TEOS layer) more rapidly than the other layers, such as the layer 12, or the top electrode 16. In a preferred embodiment, the device may then be annealed.

FIG. 2a shows the fourth stage in the process. A number of layers, for example two layers 29 and 30, of encapsulation are then applied over the two capacitors 24, 26.

FIG. 2b shows the fifth stage in the process in which a bottom electrode hardmask 32 is applied over the encapsulation layers 29, 30. The mask pattern is then lithographed onto the hardmask 32. An RIE (reactive ion etch) is applied to the device 1 to shape the bottom electrode 2 to the mask pattern, the RIE stopping at the first barrier layer 8.

Figure 2C:
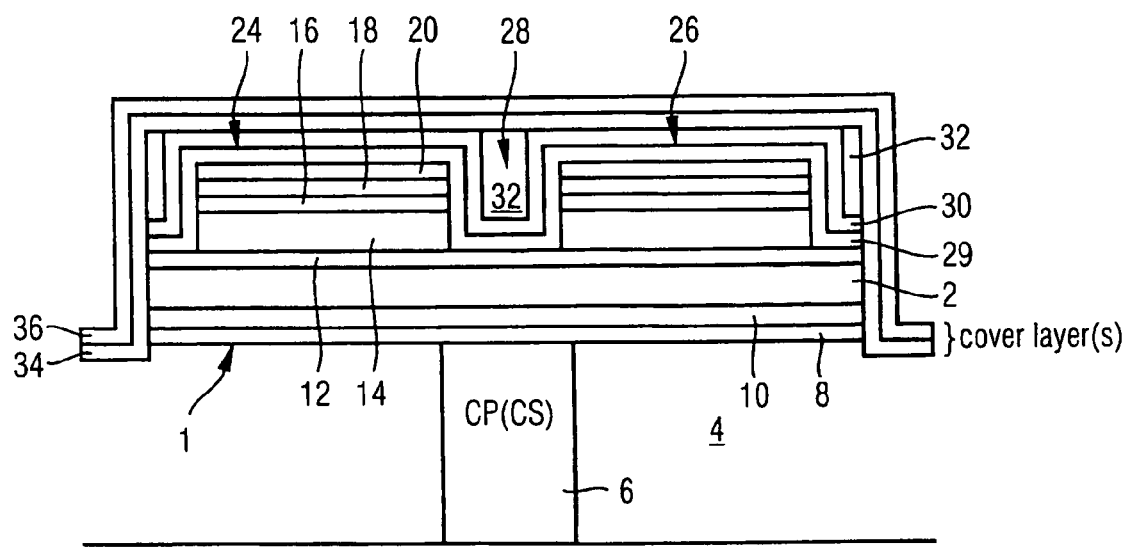
FIG. 2c is a schematic cross-sectional view of a capacitor in a sixth stage of formation according to an embodiment of the present invention.

FIG. 2c shows the sixth stage in the process. Using a further process, such as a dry etching process of the type described above, the bottom electrode hardmask 32 is removed from the surface of the capacitors 24, 26 leaving residual hardmask material 32 in the window 28 between the two capacitors 24, 26. The first barrier layer 8 is then etched through to the substrate 4, to define the shape of the first barrier layer 8. A number of cover layers 34, 36 (for example two layers as shown in FIG. 2c) are deposited over both individual capacitors 24, 26 extending from the substrate 4 to cover the encapsulation layers 29, 30.

Figure 3A:
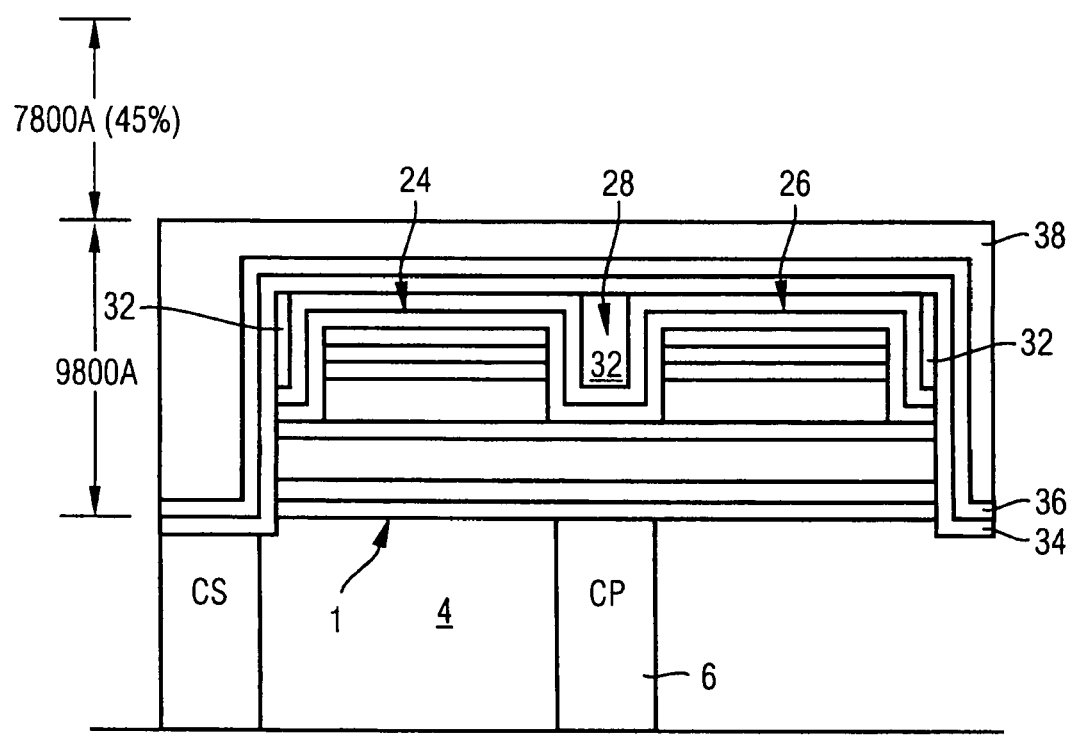

FIG. 3a shows the seventh stage in the process in which an interlayer dielectric layer 38 is deposited over the cover layers 34, 36.

The device is now ready for contact windows (not shown) for the top electrodes 16 of each capacitor 24, 26 to be formed through the interlayer dielectric 38, the cover layers 34 and 36, the encapsulation layers 29, 30, 18, 20 and into the top electrodes 16. These contact windows will then be filled with a contact metal to form a contact between the respective top electrode 16 and an interdevice connection layer laid on the surface of the interlayer dielectric layer 38, using conventional methods. Similarly, a window (not shown) will be cut to the plug 6 which will be lined with a liner and a metal filler inserted into the lined window to establish electrical contact between the bottom electrode 2 and the plug 6. The liner and the filler will then be etched back to leave just the metal contact between the bottom electrode 2 and the plug 6.

Figure 3B:
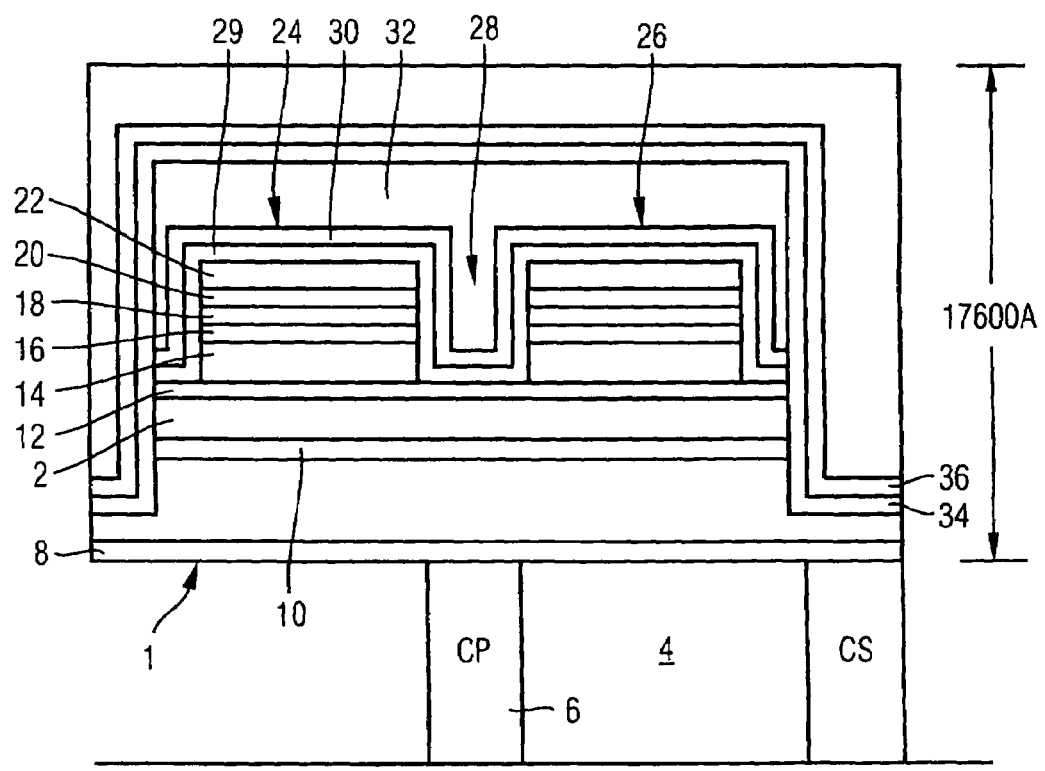

FIG. 3b shows a conventional device made using a conventional process, for comparison. The types of layers of the conventional device which correspond to the types of layers in the device according to the present invention have been given the same reference numerals as those in FIGS. 1 to 3a. From a comparison of FIGS. 3a and 3b, it will be seen that the height of the device produced according to the present invention, as shown in FIG. 3a, is approximately fifty-five percent of the height of the device produced using conventional methods, as illustrated in FIG. 3b. Conventional devices such as those shown in FIG. 3b typically have a height of around 17600 Angstroms which may be reduced to around 9800 Angstroms in devices according to the present invention. Other typical devices may have a height of around 8200 Angstroms, which may be reduced to around 5400 Angstroms in devices according to the present invention.

Also, the aspect ratio between the length of the window to the bottom electrode and the width of the window (typically 4:1 in conventional devices) may thereby be reduced in devices according to the present invention, down to a ratio of less than 3:1, enabling easier insertion of the contact liner into the window and facilitating TiN deposition into the lined window.

Thus, it will be seen that the present invention is particularly advantageous over conventional processes and devices as it is easily applied and enables the production of a device which is of significantly reduced height compared to devices produced using conventional methods which enables more devices embodying the invention to be used in systems where space is limited. Furthermore, it is believed that BEOL damage which occurs using conventional processes will be reduced or suppressed in embodiments of the present invention.

The systems and methods according to the present invention may be particularly useful in the production of devices for use, for example, as ferroelectric random access memories.

Various modifications to the embodiments of the present invention described above may be made. For example, other materials and method steps can be added or substituted for those above. Thus, although the invention has been described above using particular embodiments, many variations are possible within the scope of the claims, as will be clear to the skilled reader, without departing from the spirit and scope of the invention.

What is claimed is:

1. A method for fabricating a device having a substrate, a contact plug through the substrate, a first barrier layer on said substrate, a first electrode on said first barrier layer, a dielectric layer on said first electrode, and a second electrode on said dielectric layer, the method comprising the steps of:

forming a first hardmask over the second electrode;

etching said second electrode and said dielectric layer of said device, using said first hardmask to shape said second electrode and said dielectric layer;

removing said first hardmask;

applying one or more encapsulating layers to said second electrode and said dielectric layer;

applying a second hardmask to said one or more encapsulating layers;

etching said first electrode according to said second hardmask down to said first barrier layer; and removing said second hardmask from said one or more encapsulating layers.

2. The method of claim 1, further comprising etching said first barrier layer through to said substrate after the step of removing said second hardmask from one or more encapsulating layers.

3. The method of claim 2, further comprising applying one or more cover layers to said devices after the step of etching said first barrier layer.

4. The method of claim 1, further comprising annealing said device after the step of removing said first hardmask.

5. The method of claim 1, wherein the step of removing said first hardmask comprises applying a dry etching process.

6. The method of claim 1, wherein the step of removing said first hardmask comprises applying a dry etching process having a high etching selectivity of said dielectric layer relative to said first and/or said second electrode.

7. The method of claim 1, wherein the step of forming a dielectric layer on said first electrode comprises forming a ferroelectric layer on said first electrode.

8. The method of claim 1, wherein the step of etching said second electrode and said dielectric layer comprises etching said second electrode and said dielectric layer to divide the device into a number of devices having a common first electrode.

* * * * *